United States Patent
Yang et al.

(10) Patent No.: US 8,321,752 B1
(45) Date of Patent: Nov. 27, 2012

(54) INTEGRATED 2-LEVEL LOW DENSITY PARITY CHECK (LDPC) CODES

(75) Inventors: Xueshi Yang, Cupertino, CA (US); Nedeljko Varnica, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 441 days.

(21) Appl. No.: 12/607,129

(22) Filed: Oct. 28, 2009

Related U.S. Application Data

(60) Provisional application No. 61/113,811, filed on Nov. 12, 2008.

(51) Int. Cl.
*H03M 13/00* (2006.01)

(52) U.S. Cl. ........ 714/758; 714/757; 714/779; 714/800; 714/801

(58) Field of Classification Search ................ 714/757, 714/758, 779, 800, 801
See application file for complete search history.

(56) References Cited

U.S. PATENT DOCUMENTS

| | | | | |
|---|---|---|---|---|
| 7,516,390 B2* | 4/2009 | Shen et al. | | 714/755 |
| 7,600,180 B2* | 10/2009 | Shen et al. | | 714/801 |
| 7,827,461 B1* | 11/2010 | Low et al. | | 714/752 |
| 8,086,929 B2* | 12/2011 | Chung et al. | | 714/752 |
| 2005/0289437 A1* | 12/2005 | Oh et al. | | 714/758 |
| 2006/0020872 A1* | 1/2006 | Richardson et al. | | 714/758 |
| 2008/0126916 A1* | 5/2008 | Chung et al. | | 714/801 |
| 2011/0047432 A1* | 2/2011 | Kim et al. | | 714/752 |

\* cited by examiner

*Primary Examiner* — Charles Ehne

(57) ABSTRACT

An encoding system includes a first low density parity check (LDPC) module and a second LDPC module. The first LDPC module is configured to generate a first encoded codeword by encoding a first codeword using a first LDPC code. The second LDPC module is configured to generate a second encoded codeword by encoding a second codeword using a second LDPC code. Signals based on the first encoded codeword and signals based on the second encoded codeword are transmitted over a communications channel. The first LDPC code is defined by a first parity check matrix and the second LDPC code is defined by a second parity check matrix. The second parity check matrix includes the first parity check matrix, a zero matrix, and a supplementary matrix.

19 Claims, 8 Drawing Sheets

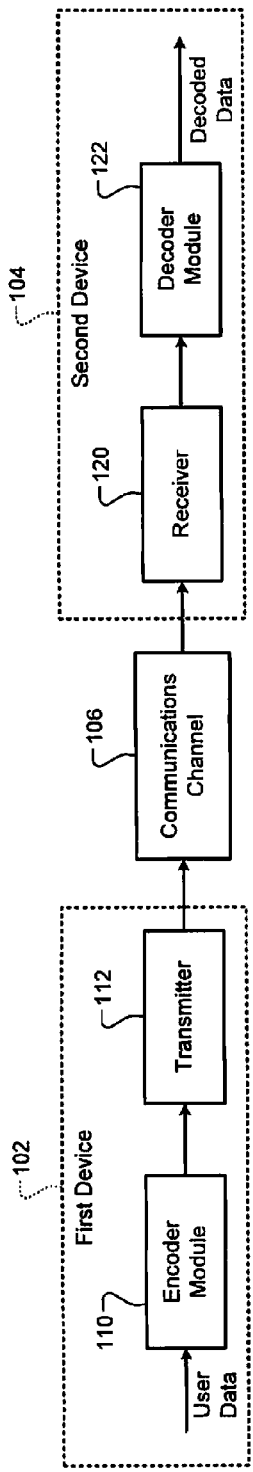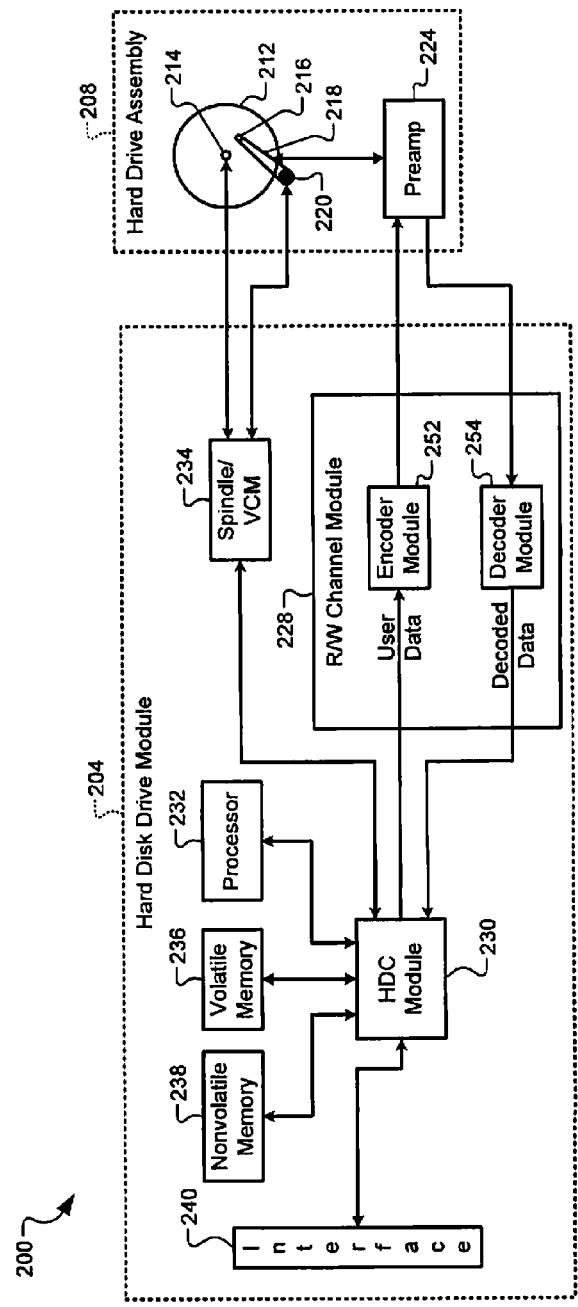

$$H_2 = \begin{bmatrix} H_1 & 0 \\ H_1' & \end{bmatrix}$$

$$H'_1 = \begin{bmatrix} H_{11} & H_{12} \end{bmatrix}$$

FIG. 10A

$$H_2 = \begin{bmatrix} H_1 & 0 \\ H_{11} & H_{12} \end{bmatrix}$$

FIG. 10B

INTEGRATED 2-LEVEL LOW DENSITY PARITY CHECK (LDPC) CODES

CROSS-REFERENCE TO RELATED APPLICATIONS

This application claims the benefit of U.S. Provisional Application No. 61/113,811, filed on Nov. 12, 2008. The disclosure of the above application is incorporated herein by reference in its entirety.

FIELD

The present disclosure relates to error coding and more particularly to 2-level low density parity check (LDPC) encoding and decoding.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Low density parity check (LDPC) codes are error-correcting codes, which allow data transmitted across a channel to be correctly decoded even when the channel is noisy. LDPC codes encode k bits of user data into an n-bit codeword, where k and n are integers and n is greater than k. The difference (n−k) between n and k determines the number of bits of redundancy of the LDPC code.

An LDPC code, C, may be specified by an m-by-n binary parity check matrix H. For purposes of illustration only, an exemplary 3-by-7 parity check matrix H is shown:

$$H = \begin{bmatrix} 1 & 1 & 1 & 1 & 1 & 1 & 1 \\ 1 & 0 & 1 & 0 & 1 & 0 & 1 \\ 0 & 1 & 0 & 1 & 0 & 1 & 0 \end{bmatrix}$$

A binary string c is a codeword in the LDPC code C if and only if $Hc = \vec{0}$. The length of each codeword is equal to the number of columns, n, of H. In the above example, H has 7 columns, and therefore codewords of the corresponding LDPC code are 7 bits long. For example only, the codeword $c = (1,0,1,0,1,0,1)^T$, where the T signifies a transpose operation, is a codeword in C. This can be verified by multiplying H by $c^T$, and observing that the result is a zero matrix.

The number of rows (m) of H specifies the number of parity check equations of the LDPC code C. Generally, the number of parity check equations of H is greater than or equal to the number of bits of redundancy. In the above example, the number of redundancy bits is 2 instead of 3. This means that the equations of H will be linearly dependent.

Linear dependence can be verified by noting that the linear combination (e.g., XOR) of any two of the rows yields the other row. The above LDPC code therefore encodes 5 bits of user data into a 7-bit codeword. Although the parity check equations of H are linearly dependent in the above example, including an additional equation may improve the accuracy of decoding.

Another example of an LDPC code is specified by the following 4-by-6 parity check matrix:

$$H = \begin{bmatrix} 1 & 1 & 0 & 1 & 0 & 0 \\ 0 & 1 & 1 & 0 & 1 & 0 \\ 1 & 0 & 1 & 0 & 0 & 1 \\ 0 & 0 & 0 & 1 & 1 & 1 \end{bmatrix}$$

This LDPC code creates codewords of 6 bits each, and includes 4 parity check equations.

LDPC codes provide good bit error rate and frame error rate performance, even at low signal-to-noise ratios. The performance of LDPC codes may be related to the codeword length: longer LDPC codes often outperform shorter codes. However, the encoder/decoder complexity also scales with codeword length. In many applications, such as flash memory, page size continues to increase. For example only, 8 kilobyte pages are now common, which may be too large to practically implement as an LDPC code.

SUMMARY

An encoding system includes a first low density parity check (LDPC) module and a second LDPC module. The first LDPC module is configured to generate a first encoded codeword by encoding a first codeword using a first LDPC code. The second LDPC module is configured to generate a second encoded codeword by encoding a second codeword using a second LDPC code. Signals based on the first encoded codeword and signals based on the second encoded codeword are transmitted over a communications channel. The first LDPC code is defined by a first parity check matrix and the second LDPC code is defined by a second parity check matrix. The second parity check matrix includes the first parity check matrix, a zero matrix, and a supplementary matrix.

In other features, the encoding system further includes an exclusive OR (XOR) module that generates the second codeword based on an XOR of the first codeword and an intermediate codeword. The encoding system further includes a second XOR module configured to generate an XOR codeword based on an XOR of the first and second encoded codewords, wherein signals based on the XOR codeword are transmitted over the communications channel. The encoding system further includes a multiplexer module configured to output the first encoded codeword and the XOR codeword for transmission over the communications channel.

In further features, the encoding system further includes a demultiplexer module configured to create first and second input codewords by demultiplexing user data. The first codeword is based on the first input codeword. The intermediate codeword is based on the second input codeword. The encoding system further includes a first error-detecting code module configured to generate the first codeword based on the first input codeword using an error-detecting code; and a second error-detecting code module configured to generate the intermediate codeword based on the second input codeword using the error-detecting code.

In still other features, the encoding system further includes N LDPC modules including the first LDPC module. N is an integer greater than or equal to 2. The N LDPC modules are configured to generate N encoded codewords based on N codewords using the first LDPC code. The N encoded codewords include the first encoded codeword. The N codewords include the first codeword. The XOR module generates the second codeword based on an XOR of the N codewords and the intermediate codeword.

A method includes generating a first encoded codeword by encoding a first codeword using a first low density parity check (LDPC) code; generating a second encoded codeword by encoding a second codeword using a second LDPC code; and transmitting signals based on the first encoded codeword and signals based on the second encoded codeword over a communications channel. The first LDPC code is defined by a first parity check matrix and the second LDPC code is defined by a second parity check matrix. The second parity check matrix includes the first parity check matrix, a zero matrix, and a supplementary matrix.

In other features, the zero matrix has a same number of rows as the first parity check matrix, and the supplementary matrix has a number of columns equal to a sum of a number of columns of the first parity check matrix and a number of columns of the zero matrix. The method further includes generating the second codeword based on an exclusive OR (XOR) of the first codeword and an intermediate codeword.

In other features, the method further includes generating an XOR codeword based on an XOR of the first and second encoded codewords, and transmitting signals based on the XOR codeword over the communications channel. The method further includes outputting the first encoded codeword and the XOR codeword for transmission over the communications channel. The method further includes creating first and second input codewords by demultiplexing user data; generating the first codeword based on the first input codeword; and generating the intermediate codeword based on the second input codeword. The method further includes generating the first codeword based on the first input codeword using an error-detecting code; and generating the intermediate codeword based on the second input codeword using the error-detecting code.

In other features, the error-detecting code is a cyclic redundancy check code. The method further includes generating N encoded codewords based on N codewords using the first LDPC code; and generating the second codeword based on an XOR of the N codewords and the intermediate codeword. N is an integer greater than or equal to 2, the N encoded codewords include the first encoded codeword, and the N codewords include the first codeword.

A decoding system includes a first low density parity check (LDPC) module configured to generate a first decoded codeword by decoding a first codeword using a first LDPC code; a second LDPC module configured to generate a second decoded codeword by decoding a second codeword using the first LDPC code; and a third LDPC module configured to selectively generate a third decoded codeword by decoding an intermediate codeword using a second LDPC code. The first and second codewords are based on signals received over a communications channel. The intermediate codeword is based on the first and second decoded codewords. The first LDPC code is defined by a first parity check matrix. The second LDPC code is defined by a second parity check matrix. The second parity check matrix includes the first parity check matrix, a zero matrix, and a supplementary matrix.

In other features, the zero matrix has a same number of rows as the first parity check matrix. The supplementary matrix has a number of columns equal to a sum of a number of columns of the first parity check matrix and a number of columns of the zero matrix. The decoding system further includes an exclusive OR (XOR) module that generates the intermediate codeword based on an XOR of the first and second decoded codewords. The decoding system further includes a decoding control module that determines whether each of the first and second codewords are decoded successfully.

In further features, the decoding system further includes a first error-detecting code module configured to determine, using an error-detecting code, whether the first codeword is decoded successfully; and a second error-detecting code module configured to determine, using the error-detecting code, whether the second codeword is decoded successfully. The first LDPC module outputs a first signal to the decoding control module indicating whether the first codeword is decoded successfully. The second LDPC module outputs a second signal to the decoding control module indicating whether the second codeword is decoded successfully.

In still other features, the decoding control module outputs a success signal when both of the first and second codewords are decoded successfully. The decoding control module outputs a failure signal when neither of the first and second codewords are decoded successfully. The decoding system further includes a multiplexer module configured to output a selected codeword of the first and second decoded codewords. When only one of the first and second codewords is decoded successfully, the multiplexer module selects the decoded codeword corresponding to the only one of the first and second codewords. The decoding system further includes a second XOR module configured to generate an XOR decoded codeword based on an XOR of the selected codeword and the third decoded codeword.

In other features, the decoding system further includes a second multiplexer module configured to output decoded data based on at least two of the first codeword, the second codeword, and the XOR decoded codeword. The decoding system further includes N LDPC modules including the first and second LDPC modules and excluding the third LDPC module. Each of the N LDPC modules is configured to generate a decoded codeword using the first LDPC code N is an integer greater than two, and the intermediate codeword is based on the decoded codewords from the N LDPC modules. An integrated circuit includes the decoding system.

A method includes generating a first decoded codeword by decoding a first codeword using a first low density parity check (LDPC) code; generating a second decoded codeword by decoding a second codeword using the first LDPC code; selectively generating a third decoded codeword by decoding an intermediate codeword using a second LDPC code; and selectively outputting decoded data based on at least two of the first decoded codeword, the second decoded codeword, and the third decoded codeword. The first and second codewords are based on signals received over a communications channel. The intermediate codeword is based on the first and second decoded codewords. The first LDPC code is defined by a first parity check matrix and the second LDPC code is defined by a second parity check matrix. The second parity check matrix includes the first parity check matrix, a zero matrix, and a supplementary matrix.

In still other features, the systems and methods described above are implemented by a computer program executed by one or more processors. The computer program can reside on a computer readable medium such as but not limited to memory, nonvolatile data storage, and/or other suitable tangible storage mediums.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein:

FIG. 1 is a functional block diagram of two devices communicating over a communications channel;

FIG. 2 is a functional block diagram of a hard disk drive;

FIG. 10A is a graphical depiction of matrix $H_1'$ as split into sub-matrices $H_{11}$ and $H_{12}$; and FIG. 10B is a graphical depiction of matrix $H_2$ including sub-matrices $H_{11}$ and $H_{12}$.

DESCRIPTION

Figures 3, 4:
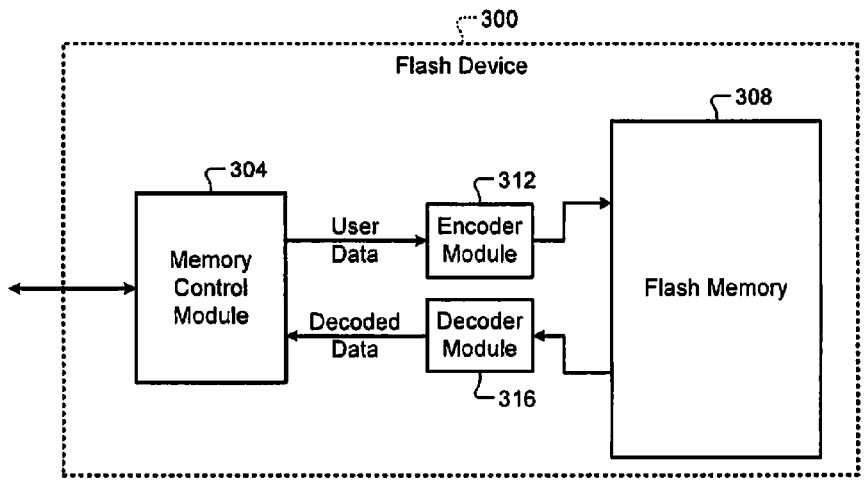
FIG. 3 is a functional block diagram of a flash device.
FIG. 4 is a graphical depiction of a parity check matrix for an exemplary 2-level LDPC code.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical OR. It should be understood that steps within a method may be executed in different order without altering the principles of the present disclosure.

As used herein, the term module may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Referring now to FIG. 1, a first device 102 transmits data to a second device 104 over a communications channel 106. For example only, the communications channel 106 may be a wired medium, such as twisted pair, or may be a wireless medium. For example, the first and second devices 102 and 104 may implement a third or fourth generation mobile standard such as long term evolution (LTE), a wireless local area network (WLAN) such as WiFi, and/or WiMAX.

The first device 102 includes an encoder module 110 that receives user data and generates encoded data. The encoder module 110 may implement one or more error-detecting and/or error-correcting schemes. For example only, the encoder module 110 may implement forward error correction, which adds redundant information to the user data to allow transmission errors to be corrected by the second device 104. The encoder module 110 may also implement error-detecting codes, which allow for errors to be detected, but not necessarily corrected.

In various implementations, the encoder module 110 may implement the error checking code as an outer code and the error correcting code as an inner code. In other words, an error checking code is applied to the user data to create protected user data. The protected user data is then encoded with the error correcting code before being transmitted.

For example only, the error correcting code may generate the protected user data by appending a checksum or a cyclic redundancy check (CRC) value to the user data. When received data is decoded, the error checking code can be used to verify that the protected user data has been correctly decoded. For example, the stored checksum or CRC value can be compared to a value recalculated based on the user data portion of the decoded data. If the stored and newly calculated values are equal, there is a high probability that decoding was successful and that the decoded user data will be the same as the user data provided to the encoder module 110. Although CRC is used as an example, other hash functions may be used.

The encoder module 110 provides the encoded data to a transmitter 112, which transmits the encoded data over the communications channel 106. A receiver 120 of the second device 104 may receive the encoded data from the communications channel 106. The received data is provided to a decoder module 122. The decoder module 122 attempts to retrieve the original user data from the received data. For example only, as described above, an inner error correcting code may be used to attempt to correct errors introduced by the communications channel 106.

The decoded data may include protected user data encoded according to an outer code. The decoder module 122 may use the outer code to verify the accuracy of the protected user data. The decoder module 122 may then decode the protected user data using the outer code and output the decoded data. For example only, the decoder module 122 may decode the protected user data by removing the checksum or CRC value.

In various implementations, the first and second devices 102 and 104 may be co-located. When co-located, the first and second devices 102 and 104 may share some or all components. For example only, a digital signal processor (DSP) may perform some or all of the functions of the encoder module 110 and the decoder module 122. As another example, an amplifier or preamplifier may be shared by the transmitter 112 and the receiver 120.

In a broad sense, the communications channel 106 can be a storage medium. For example only, the storage medium may include a volatile memory, a non-volatile memory, and/or longer-term storage, such as a hard drive, an optical drive, or a tape drive. Storage devices may be thought of as communications channels because data that is transmitted (written) to the storage device may include errors when later received (read). Therefore, encoding according to the principles of the present disclosure may be used with storage devices. FIGS. 2 and 3 are examples of a hard drive and a flash device, respectively, including encoding and decoding functionality according to the principles of the present disclosure.

Referring now to FIG. 2, a hard disk drive (HDD) 200 includes an HDD module 204 and a hard disk assembly (HDA) 208. The HDA 208 includes a circular platter 212, which has a magnetic surface that is used to store data magnetically. Data may be stored in binary form as a magnetic field of either positive or negative polarity. The platter 212 may be combined with other platters to form a stack, and the stack is rotated by a spindle motor 214. A read/write head ("head") 216 reads data from and writes data on the magnetic surface of the platter 212.

In various implementations, a head may be implemented for each surface of the platter 212. For example only, when the HDA 208 includes four platters, eight heads may be implemented. The head 216 includes a write element, such as an inductor, that generates a magnetic field and a read element, such as a magnetoresistive (MR) element, that senses the magnetic field on the platter 212.

The head 216 is mounted at a distal end of an actuator arm 218. An actuator, such as a voice coil motor (VCM) 220, moves the actuator arm 218 relative to the platter 212. The HDA 208 includes a pre-amplifier device ("preamp") 224 that amplifies signals received from and sent to the head 216.

When writing data, the preamp 224 generates a write current that flows through the write element of the head 216. The write current is switched to produce a positive or negative magnetic field on the magnetic surface of the platter 212. When reading data, the magnetic fields stored in the magnetic surface of the platter 212 induce low-level analog signals in the read element of the head 216. The preamp 224 amplifies the low-level analog signals and outputs amplified analog signals to a read/write (R/W) channel module 230 of the HDD module 204.

The HDD module 204 includes the R/W channel module 228, a hard disk controller (HDC) module 230, a processor 232, a spindle/VCM driver module 234, volatile memory 236, non-volatile memory 238, and an input/output (I/O) interface 240. During write operations, the R/W channel module 228 receives user data. Specifically, an encoder module 252 of the R/W channel module 228 receives the user data and encodes the user data according to the principles of the present disclosure. The encoded data is transmitted to the preamp 224.

During read operations, a decoder module 254 of the R/W channel module 228 receives analog signals from the preamp 224. The decoder module 254 decodes the received data and outputs decoded data to the HDC module 230. In various implementations, the R/W channel module 228 may include additional functionality (not shown), such as digital to analog conversion and analog to digital conversion. In addition, analog-domain and digital-domain processing may be performed, including but not limited to filtering, amplifying, and further encoding/decoding.

The HDC module 230 controls operation of the HDD 200. For example, the HDC module 230 generates commands that control the speed of the spindle motor 214 and the movement of the actuator arm 218. The spindle/VCM driver module 234 implements the commands and generates control signals that control the speed of the spindle motor 214 and the positioning of the actuator arm 218. Additionally, the HDC module 230 communicates with an external device (not shown), such as a host adapter within a host device, via the I/O interface 240. The HDC module 230 may receive data to be stored from the external device, and may transmit received data to the external device.

The processor 232 processes data, which may include encoding, decoding, filtering, and/or formatting. Additionally, the processor 232 may process servo or positioning information to position the head 216 over the platter 212 during read/write operations. Servo, which may be stored on the platter 212, allows accurate read and write locations to be determined with respect to the platter 212. In various implementations, a self-servo write (SSW) module (not shown) may write servo on the platter 212 using the head 216 prior to user data being received by the HDD 200.

Referring now to FIG. 3, a flash device 300 according to the principles of the present disclosure is presented. The flash device 300 includes a memory control module 304, which receives write data from an external device and supplies read data to the external device. A flash memory 308 may include multiple flash memory cells, which may include multi-level cells that encode more than one bit of information. For example only, the flash memory 308 may include flash memory cells in a NAND configuration or in a NOR configuration.

The memory control module 304 determines where within the flash memory 308 the write data should be stored, and provides user data based on the write data to an encoder module 312. The encoder module 312 applies an error correcting code to the user data and provides the encoded data to the flash memory 308. The encoder module 312 may first apply an error-detecting code to the user data before encoding using the error correcting code.

When the memory control module 304 receives a request for data from the flash memory 308, the memory control module 304 instructs the flash memory 308 to provide data to a decoder module 316. The data received from the flash memory 308 may include errors introduced during reading from and/or writing to the flash memory 308 or while stored in the flash memory 308. The decoder module 316 decodes the received data and attempts to correct any detected errors.

The decoder module 316 may verify that the decoding was accurate by applying the outer code to the decoded data. The decoder module 316 provides decoded data to the memory control module 304. In various implementations, if the outer code indicates that decoding was not accurate, the decoder module 316 may provide a decoding failure signal to the memory control module 304 instead of the decoded data.

Data may be written to and/or read from the flash memory 308 in units of pages. For example only, a page may include 4,096 bytes or 8,192 bytes. For example only, each page may be encoded as one codeword.

Low density parity check (LDPC) codes may provide excellent bit error rate and frame error rate performance, even when used with a low signal-to-noise ratio communications channel. Although the performance of LDPC codes may increase with code length, encoder/decoder complexity scales with code length. For example, an 8,192 byte LDPC code may be too complex or expensive to implement. Implementation complexity generally increases processing time, reducing throughput. Processing time may be reduced by increasing the amount of hardware, but this increases cost, power consumption, and layout area.

According to the principles of the present disclosure, a 2-level LDPC code is described, which may increase error rate performance with minimal additional layout area. For example only, a 2-level LDPC code may approach the performance of standard LDPC codes that are twice as long or longer than the 2-level LDPC code.

Referring now to FIG. 4, parity check matrices for an exemplary 2-level LDPC code are shown. A first level code (LDPC_1) is defined by parity check matrix $H_1$, which has $m_1$ rows and $n_1$ columns. A second level code (LDPC_2) is defined by parity check matrix $H_2$, which has $(m_1+m_1')$ rows and $(n_1+n_0)$ columns. The upper left portion of $H_2$ is defined by $H_1$. Meanwhile, the elements in the last $n_0$ columns of the first $m_1$ rows of $H_2$ are zero elements. In other words, an $(m_1 \times n_0)$ zero-matrix defines the upper right of $H_2$.

The bottom $m_1'$ rows of $H_2$ are defined by a matrix labeled $H_1'$. For example only, $m_1'$ and $n_0$ may be equal. Although labeled $H_1'$, $H_1'$ is not necessarily simply a variant of $H_1$. However, $H_1'$ may be determined based on $H_1$. For example, once the design of $H_1$ has been fixed, design constraints can be specified for $H_2$ and then elements of $H_1'$ that satisfy these constraints can be iteratively determined.

The number of additional parity check equations defined by $H_2$ when compared to $H_1$ may be equal to the value of $m_1'$. Because of the additional parity check equations, $H_2$ may be said to define a strong code, while $H_1$ may be said to define a weak code. Because $H_2$ includes $H_1$ as well as additional elements, which impose limits on the code space of $H_1$, $H_2$ may be referred to as a sub-code of $H_1$.

To create L-level codes, where L is greater than two, $H_1$ can be partitioned recursively. Therefore, to make a three-level code (L=3), $H_1$ can be divided into an upper right zero-matrix, an upper left matrix (which may be called $H_0$), and a bottom matrix (which may be called $H_0'$). To make a four-level code (L=4), $H_0$ may be further partitioned.

Alternatively, a three-level code (L=3) may be designed by creating a sub-code of $H_2$, where $H_2$ defines the upper left portion of a matrix $H_3$. The upper right portion of $H_3$ includes a zero-matrix, while a matrix $H_2'$ defines the remaining elements in $H_3$ below $H_2$ and the zero-matrix. A four-level code (L=4) can be created by defining another sub-code, $H_4$, of $H_3$.

Figure 5:
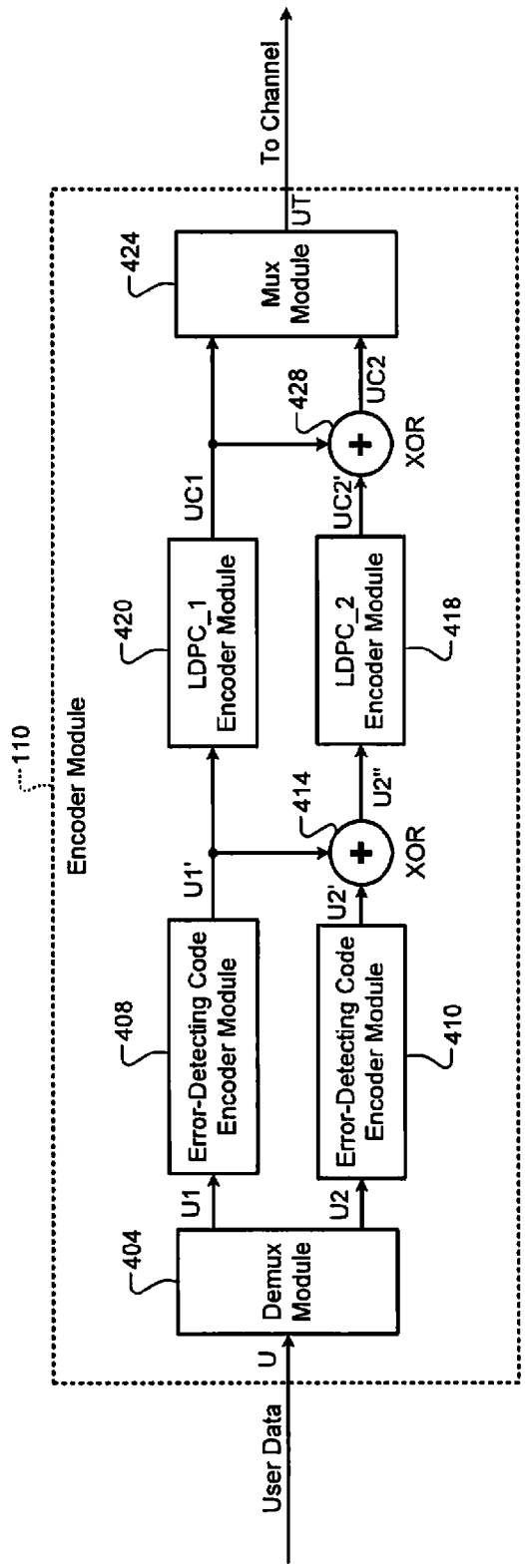
FIG. 5 is a functional block diagram of an exemplary implementation of an encoder module.

Referring now to FIG. 5, a functional block diagram of an exemplary implementation of the encoder module 110 is presented. The encoder module 110 includes a demultiplexer module 404. The demultiplexer module 404 receives user data and demultiplexes the user data into multiple data streams. For example only, the demultiplexer module 404 may output two streams of user data.

Error-detecting code encoder modules 408 and 410 receive the first and second user data streams, respectively, from the demultiplexer module 404. The error-detecting code encoder modules 408 and 410 encode the received data using an error-detecting code. For example only, the error-detecting code may include single or multiple-bit parity, a checksum, and/or a cyclic redundancy check (CRC). The error-detecting code encoder modules 408 and 410 may both implement the same error-detecting code or may implement different error-detecting codes.

For example only, the error-detecting code encoder modules 408 and 410 may perform error-detecting code encoding by appending an error-detecting value to received user data, where the error-detecting value is calculated based on the received user data. With stronger forms of error-detecting codes, such as CRCs, there is an extremely low probability that an error is present when the recovered user data matches a recovered error-detecting value. The data generated by the error-detecting code encoder modules 408 and 410 may therefore be referred to as protected user data.

A first XOR module 414 receives the protected user data from the error-detecting code encoder modules 408 and 410. The first XOR module 414 performs a binary XOR operation on the protected user data and outputs a result to an LDPC_2 encoder module 418. XOR modules, including the first XOR module 414, may append zeros to the beginning or end of one of their inputs, known as zero-padding, to equalize the lengths of the inputs.

The protected user data from the error-detecting code encoder module 408 is received by an LDPC_1 encoder module 420. The LDPC_1 encoder module 420 encodes the protected user data using an LDPC code specified by the parity check matrix $H_1$. Encoded data from the LDPC_1 encoder module 420 is provided to a multiplexer module 424 and to a second XOR module 428.

The LDPC_2 encoder module 418 encodes data received from the first XOR module 414 using an LDPC code specified by the parity check matrix $H_2$, and provides encoded data to the second XOR module 428. The second XOR module 428 performs an XOR operation on the encoded data and outputs a result of the XOR operation to the multiplexer module 424.

The multiplexer module 424 multiplexes received codewords into a data stream for transmission over the communications channel. For example only, the multiplexer module 424 may output a codeword from the LDPC_1 encoder module 420 followed by a codeword from the second XOR module 428 in alternating succession. Alternatively, the multiplexer module 424 may interleave portions of received codewords.

Figure 6:
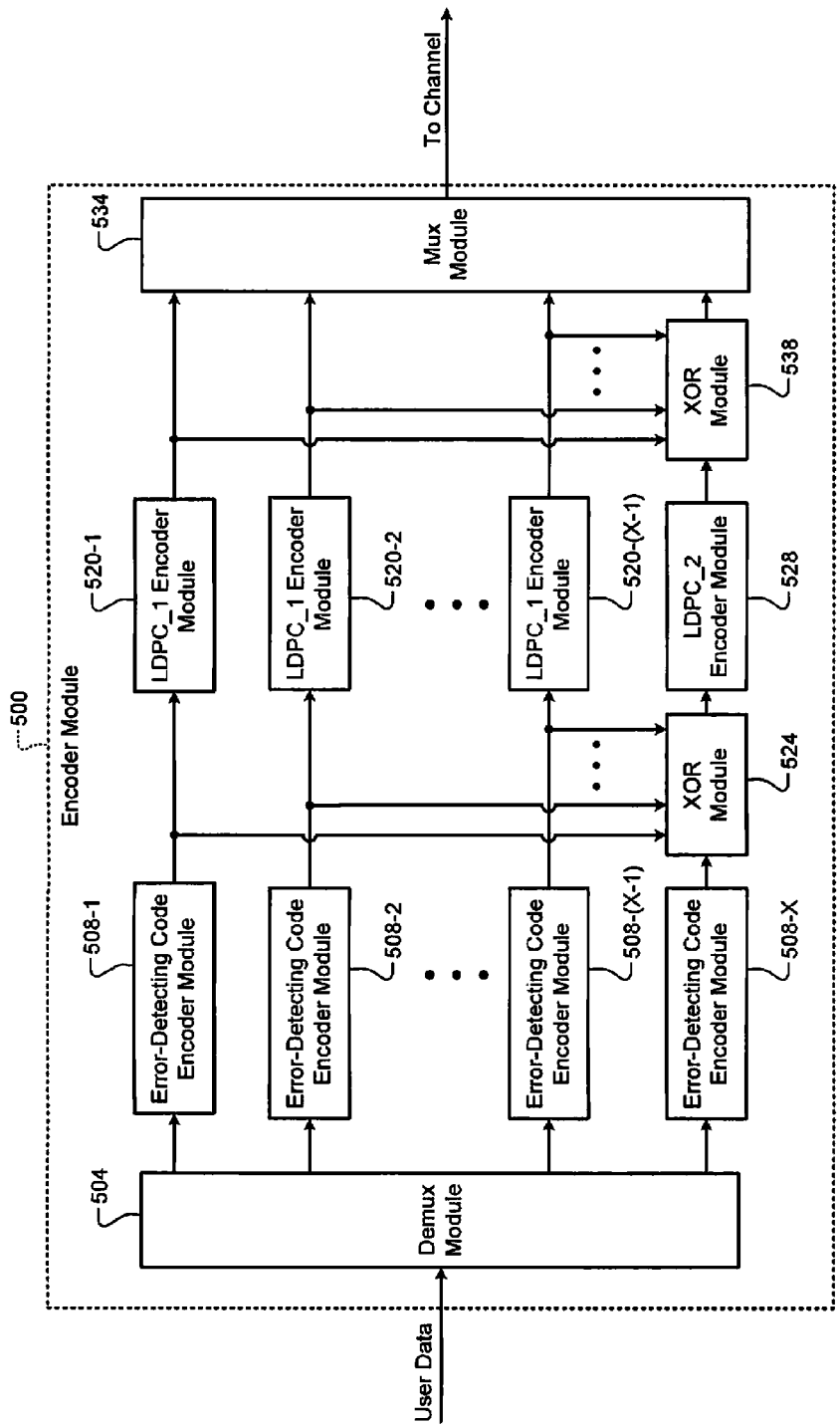
FIG. 6 is a functional block diagram of another exemplary implementation of an encoder module.

Referring now to FIG. 6, a functional block diagram of an exemplary implementation of an encoder module 500 that generates more than two component codewords is presented. The encoder module 500 includes a demultiplexer module 504 that demultiplexes user data into X user data streams. The X user data streams are received by error-detecting code encoder modules 508-1, 508-2, . . . 508-(X−1), and 508-X, respectively. In various implementations, however, the error-detecting code encoder modules 508 may be omitted.

Outputs of the error-detecting code encoder modules 508-1 . . . 508-(X−1) are received by LDPC_1 encoder modules 520-1, 520-2, . . . 520-(X−1), respectively. In addition, the outputs of the error-detecting code encoder modules 508-1 . . . 508-(X−1) are received by a first XOR module 524. The first XOR module 524 XORs each of the outputs of the error-detecting code encoder modules 508-1 . . . 508-(X−1) with each other and with an output of the error-detecting code encoder module 508-X. A result of the XOR operation is provided to LDPC_2 encoder module 528.

The LDPC_1 encoder modules 520-1 . . . 520-(X−1) encode received data using an LDPC code specified by the parity check matrix $H_1$ and output the results to a multiplexer module 534 as well as a second XOR module 538. The LDPC_2 encoder module 528 encodes received data using an LDPC code specified by the parity check matrix $H_2$ and outputs a result to the second XOR module 538. The second XOR module 538 performs an XOR operation on the received data and provides a result to the multiplexer module 534. The multiplexer module 534 outputs a data stream for transmission over the communications channel. In various implementations, the multiplexer module 534 may output a codeword from each of the inputs in a round-robin manner.

Figure 7:
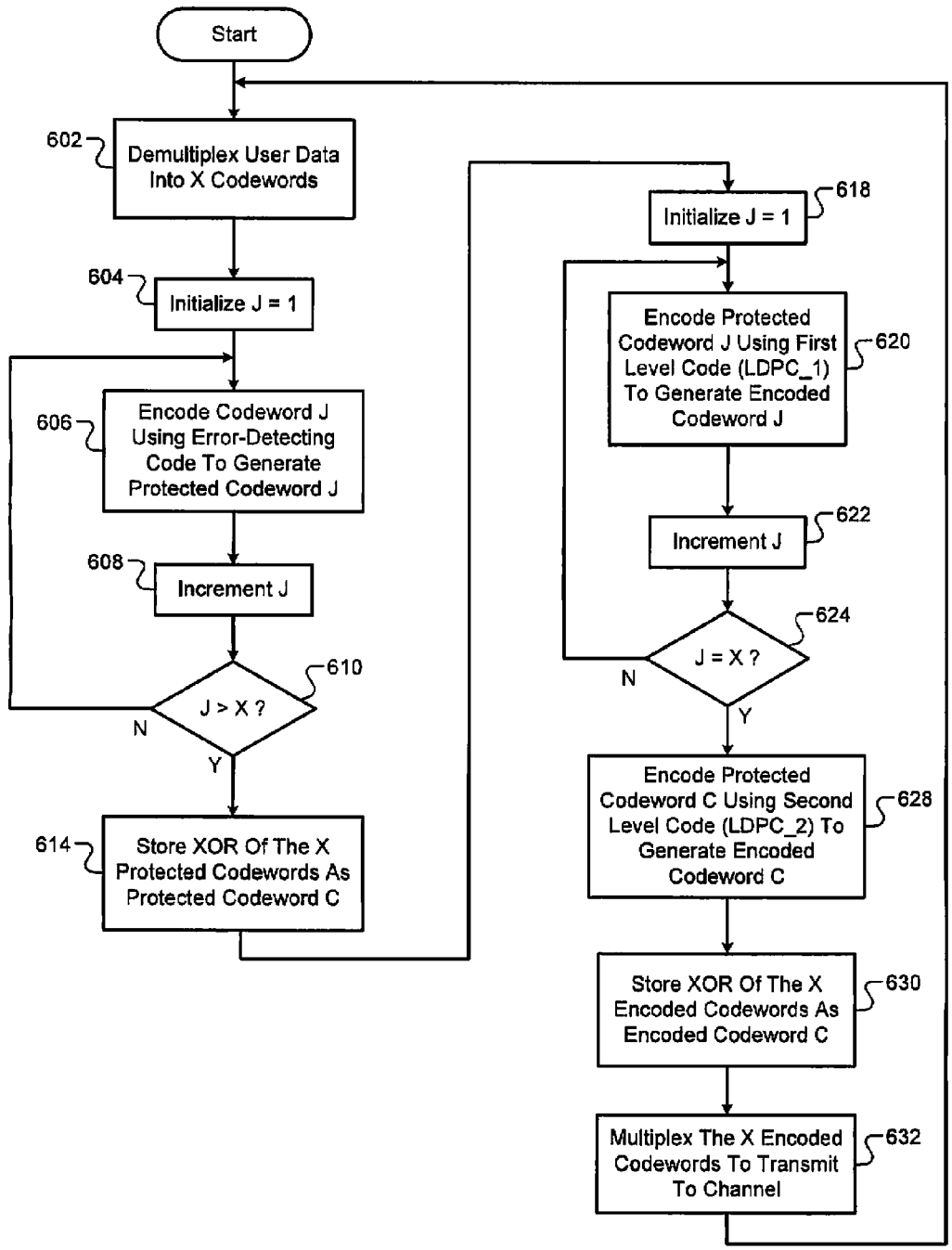
FIG. 7 is a flowchart depicting an exemplary encoding method.

Referring now to FIG. 7, a flowchart depicts an exemplary encoding method. For example only, the encoder module 500 of FIG. 6 may implement the following control. Control starts at 602, where user data is demultiplexed into x codewords. Control continues at 604, where a temporary index variable J is set to the value 1. Control continues at 606, where error-detecting code encoding is performing on codeword J to generate protected codeword J. Control continues at 608, where J is incremented.

Control continues at 610, where control determines whether J is greater than the number of codewords, X. If so, control transfers to 614; otherwise, control returns to 606. At 614, control performs an XOR of the X protected codewords and stores the result as protected codeword C (the last of the protected codewords). In other words, the value of the Xth protected codeword, protected codeword C, is replaced with an XOR of all X of the protected codewords.

Control continues at 618, where J is reset to 1. Control continues at 620, where protected codeword J is encoded using the first level code, LDPC_1, to generate an encoded codeword J. The first level code is defined by the parity check matrix $H_1$. Control continues at 622, where J is incremented. Control continues at 624, where control determines whether J is equal to the number of codewords, X. If so, all but the last protected codeword has been encoded with LDPC_1, and control transfers to 628; otherwise, control returns to 620.

At 628, control encodes the last protected codeword, protected codeword C, using the second level code, LDPC_2. The second level code is specified by the parity check matrix $H_2$. Control continues at 630, where an XOR operation is performed on the X encoded codewords and the result is stored back into encoded codeword C. Control continues at 632, where the X encoded codewords are multiplexed for transmission over the communications channel. Control then returns to 602.

Figure 8:
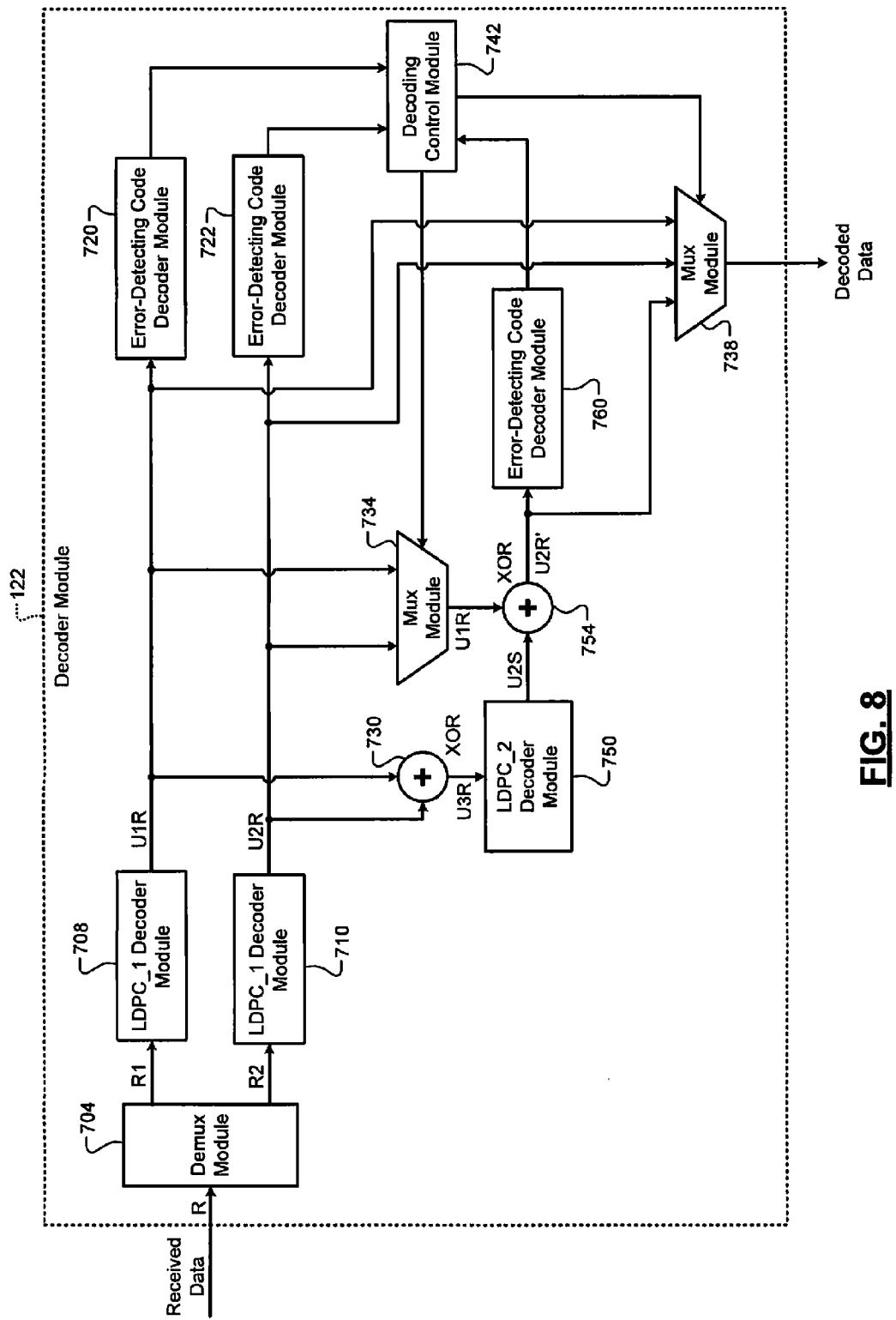
FIG. 8 is a functional block diagram of an exemplary implementation of a decoder module.

Referring now to FIG. 8, a functional block diagram of an exemplary implementation of the decoder module 122 is presented. A demultiplexer module 704 demultiplexes data received from the communications channel. For ease of illustration, the decoder module 122 is shown for a 2-level code having 2 component codewords. However, the decoder module 122 could be extended to decoding codes having more than 2 levels. The demultiplexer module 704 outputs received data streams to LDPC_1 decoder modules 708 and 710. The LDPC_1 decoder modules 708 and 710 decode the received data using the LDPC_1 code specified by $H_1$.

The LDPC_1 decoder modules 708 and 710 respectively output first and second decoded codewords to error-detecting code decoder modules 720 and 722, respectively. In addition, the decoded codewords are provided to a first XOR module 730, a first multiplexer module 734, and a second multiplexer module 738. The LDPC_1 decoder modules 708 and 710 may each also signal whether decoding was successful or unsuccessful to a decoding control module 742.

The error-detecting code decoder modules 720 and 722 may be omitted or disabled in implementations where there is no outer error-detecting code. However, when present, the error-detecting code decoder modules 720 and 722 verify whether the first and second decoded codewords, respectively, have been decoded successfully.

In various implementations, the error-detecting code decoder modules 720 and 722 may calculate an error-detecting value, such as a CRC, checksum, or parity value. The error-detecting value is then compared to a value stored in the respective decoded codeword. If the newly calculated value matches the stored value, there is a very low probability that the decoded codeword differs from the original data that was encoded. If the decoding control module 742 determines that the decoded codewords from the LDPC_1 decoder modules 708 and 710 are both valid, decoding has succeeded. The decoding control module 742 therefore instructs the second multiplexer module 738 to output the first and second decoded codewords.

When the outer error-detecting code is implemented, the second multiplexer module 738 may strip the stored error-detecting values from the decoded codewords prior to outputting the decoded data. In various implementations, however, the outer error-detecting code may modify the user data, and therefore the outer error-detecting code cannot be decoded simply by removing an appended value. In such cases, the error-detecting code decoder modules 720 and 722 may decode the outer error-detecting code. The second multiplexer module 738 then outputs the decoded data based on decoded outputs from the error-detecting code decoder modules 720 and 722.

If more than one of the decoded codewords from the LDPC_1 decoder modules 708 and 710 is determined to have been decoded unsuccessfully, the decoding control module 742 may signal decoding failure. When one of the decoded codewords from the LDPC_1 decoder modules 708 and 710 is determined to have been decoded unsuccessfully, the second level LDPC code will be employed. The decoding control module 742 instructs the first multiplexer module 734 to output the successfully decoded codeword to a second XOR module 754. The decoding control module 742 may also instruct the second multiplexer module 738 to output the successfully decoded codeword.

The first XOR module 730 generates an output based on an XOR of the decoded codewords from the LDPC_1 decoder modules 708 and 710. An LDPC_2 decoder module 750 receives the output from the first XOR module 730. The LDPC_2 decoder module 750 decodes the output according to the second level LDPC code, which is specified by the parity check matrix $H_2$.

If the LDPC_2 decoder module 750 is unable to decode the data, the decoding control module 742 may indicate decoding failure. Otherwise, if decoding is successful, the LDPC_2 decoder module 750 outputs decoded data to the second XOR module 754. The second XOR module 754 XORs the successfully decoded codeword from the first multiplexer module 734 with the output of the LDPC_2 decoder module 750.

A result of the XOR operation is provided to the second multiplexer module 738 and to an error-detecting code decoder module 760. The error-detecting code decoder module 760 may be omitted in various implementations, or may be disabled when no outer error-detecting code is present. However, when the error-detecting code decoder module 760 is enabled, the error-detecting code decoder module 760 evaluates whether the output of the second XOR module 754 is an accurate copy of the data originally encoded.

If the error-detecting code decoder module 760 determines that the output of the second XOR module 754 is not accurate (e.g., if a newly calculated CRC does not match the stored CRC), the decoding control module 742 may indicate that decoding has failed. In various implementations, outer error-detecting code encoding may be implemented by more than simply appending an error-detecting code value. In such implementations, the second multiplexer module 738 may receive an output from the error-detecting code decoder module 760, which decodes the outer error-detecting code.

In various implementations, additional LDPC_1 decoder modules may be present. For example only, N LDPC_1 decoder modules, including the LDPC_1 decoder modules 708 and 710, where N is greater than two. The demultiplexer module 704 outputs received data streams to each of the N LDPC_1 decoder modules. Each of the N LDPC_1 decoder modules generate a decoded codeword by decoding the received data using the LDPC_1 code specified by $H_1$. The first XOR module 730 generates an output based on an XOR of the decoded codewords from the N LDPC_1 decoder modules.

The decoding control module 742 determines whether the decoded codewords were decoded successfully. If some, but not all, of the decoded codewords were decoded successfully, the decoding control module 742 selects one of the decoded codewords that decoded successfully. The first multiplexer module 734 outputs the selected decoded codeword to the second XOR module 754. Additional error-detecting code decoder modules may be present to evaluate whether the decoded codewords were decoded successfully.

Figure 9:
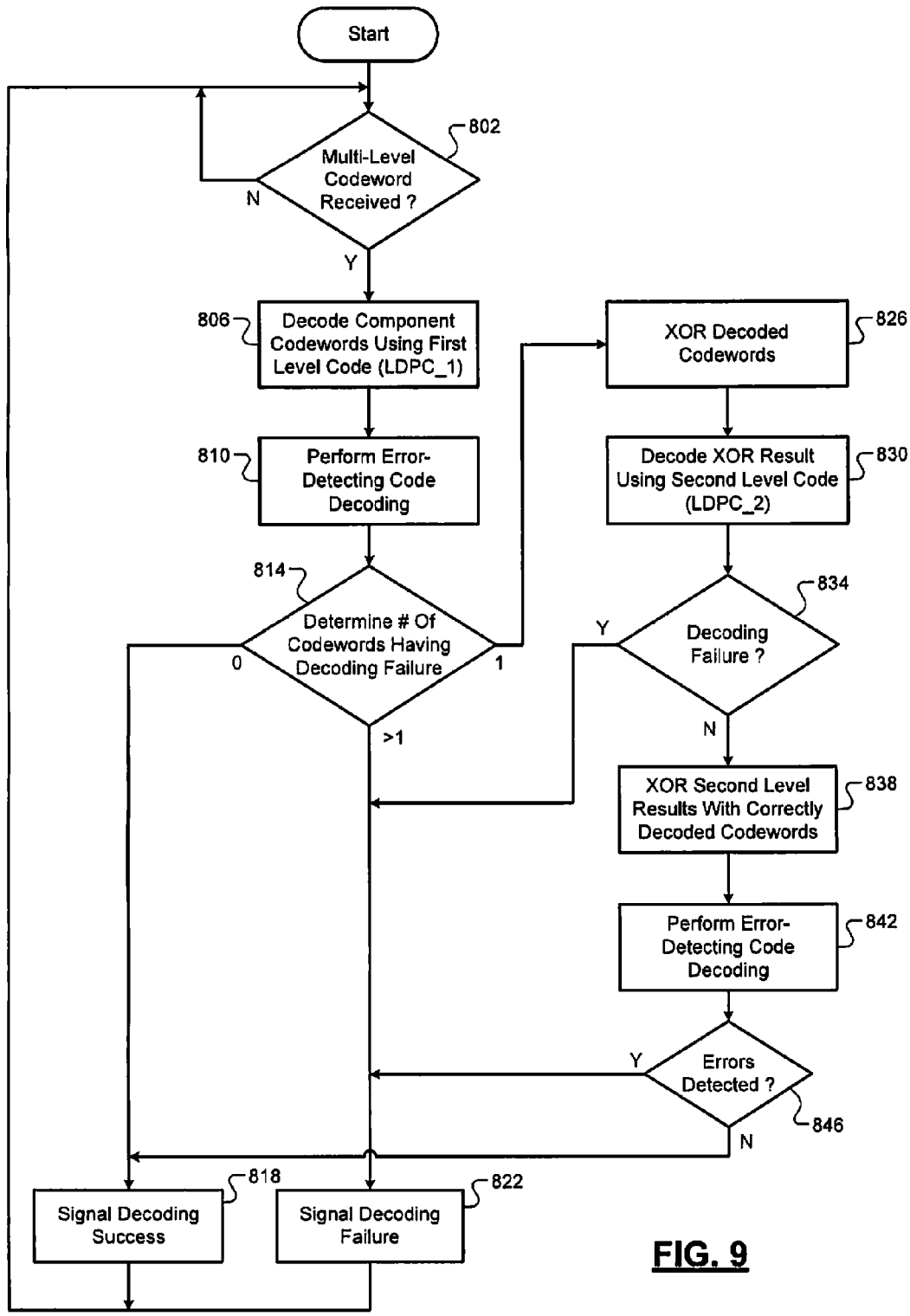
FIG. 9 is a flowchart depicting an exemplary decoding method.

Referring now to FIG. 9, a flowchart depicts an exemplary method of operating a decoder according to the principles of the present disclosure. For example only, the decoder module 122 of FIG. 8 may perform the following control. Although the decoder module 122 was described with respect to a 2-level codeword, the control applies to systems where LDPC codes having more than two levels are employed.

Control starts at 802, where control waits until a multi-level codeword is received. When a multi-level codeword is received, control transfers to 806; otherwise, control remains in 802. At 806, control decodes each of the received component codewords using the first level code, LDPC_1, to produce decoded codewords. Control continues at 810, where control may perform error-detecting code decoding.

Control continues at 814, where control determines the number of decoded codewords that were decoded unsuccessfully. Unsuccessful decoding may be indicated either by a failure of the first-level code or a determination by an error-detecting code that the original data has not been accurately decoded. Control transfers based on the number of decoded codewords that were unsuccessfully decoded.

When zero codewords have a decoding failure, control transfers to 818. When more than one codeword has decoding failures, control transfers to 822. When one codeword has a decoding failure, control transfers to 826. At 818, control signals decoding success, outputs the successfully decoded codewords, and returns to 802. At 822, control signals decoding failure. Control may also output any codewords that were successfully decoded. Control then returns to 802.

At 826, control XORs the decoded component codewords. Control continues at 830, where the result of the XOR of 826 is decoded using a second level code LDPC_2. Control continues at 834, where control determines whether the decoding using the second level code was unsuccessful. If so, control transfers to 822; otherwise, control transfers to 838. At 838, control XORs the decoded data from the second level code with the correctly decoded codeword or codewords.

Control continues at 842, where error-detecting code decoding is performed on the results of the XOR of 838. Control continues at 846, where if errors are detected by the error-detecting code, control transfers to 822; otherwise, control transfers to 818. In various implementations, 810 and 842 may be omitted when an outer error-detecting code was not used to encode the received data.

A simplified mathematical example of encoding and decoding for illustration purposes only is presented for a two-level LDPC code. In this example, $H_2$ is a 4×8 matrix and $H_1$ is a 2×6 matrix (sub-matrix of $H_2$):

$$H_2 = \begin{bmatrix} 1 & 0 & 1 & 1 & 0 & 1 & 0 & 0 \\ 1 & 1 & 0 & 0 & 1 & 0 & 0 & 0 \\ 0 & 1 & 1 & 0 & 1 & 0 & 1 & 0 \\ 0 & 0 & 0 & 1 & 0 & 1 & 0 & 1 \end{bmatrix},$$

where $H_2$ is formed by $$H_1 = \begin{bmatrix} 1 & 0 & 1 & 1 & 0 & 1 \\ 1 & 1 & 0 & 0 & 1 & 0 \end{bmatrix},$$

$$H_1' = \begin{bmatrix} 0 & 1 & 1 & 0 & 1 & 0 & 1 & 0 \\ 0 & 0 & 0 & 1 & 0 & 1 & 0 & 1 \end{bmatrix},$$

and a 2×2 zero-matrix.

In this example, a 6-bit block of user data (U) is encoded, where U=[1 0 0 1 1 1]. For purposes of illustration only, FIG. 5 is labeled with the following variables because the following encoding method can be implemented by the encoder module 110 of FIG. 5. The user data U is demultiplexed into two messages U1=[1 0 0] and U2=[1 1 1]. For example only, single-bit parity may be used as an error checking code. In a practical implementation, a stronger form of error checking code may be used, such as a checksum or a cyclic redundancy check.

In this example, even parity may be applied: the added parity bit is calculated so that the resulting codeword has even parity. In even parity, the sum of the 1's is an even number. For U1, a 1 bit is appended to create even parity, creating U1'=[1 0 0 1]. A 1 bit is also appended for U2 to create U2'=[1 1 1 1].

U1' is encoded by LDPC_1 (defined by parity check matrix $H_1$) to create UC1=[1 0 0 1 1 0]. The parity-protected U1' and U2' are combined with an XOR (exclusive OR) operation to create U2''=[0 1 1 0]. U2'' is encoded by LDPC_2 (defined by parity check matrix $H_2$) to create UC2'=[0 1 1 0 1 1 1 1].

UC1 is padded with zeros to create UC1E=[1 0 0 1 1 0 0 0], which is XORed with UC2' to create UC2=[1 1 1 1 0 1 1 1]. UC1 and UC2 are then multiplexed and transmitted through the communications channel. Multiplexing may be performed by concatenating UC1 and UC2 to create a transmission codeword UT=[1 0 0 1 1 0 1 1 1 1 0 1 1 1].

When UT is transmitted through the communications channel, errors may be introduced. For purposes of illustration only, FIG. 8 is labeled with the following variables because the following decoding method can be implemented by the decoder module 122 of FIG. 8. Received data R is demultiplexed into streams R1 and R2. R1 and R2 are then decoded using LDPC_1 to generate U1R and U2R, respectively. For example only, assume that U1R=[1 0 0 1 1 0] and U2R=[1 0 1 1 0 1 1 1]. The first 4 bits of U1R have even parity, indicating that U1R was decoded successfully. However, the first four bits of U2R do not have even parity, indicating that decoding failed for U2R.

Because of the decoding failure, U1R (zero-padded to equal the length of U2R) and U2R are XORed to create U3R=[0 0 1 0 1 1 1 1]. U3R is then decoded using LDPC_2 to produce U2S. For example only, assume that U2S=[0 1 1 0 1 1 1 1]. Assuming that LDPC_2 decoding indicated success, U2S is XORed with a zero-padded U1R (the successfully decoded codeword), resulting in U2R'=[1 1 1 1 0 1 1 1]. The first 4 bits of U2R' have even parity, indicating that U2R' was decoded successfully. The first 3 bits of U1R ([1 0 0]) and the first 3 bits of U2R' ([1 1 1]) are output as user data: [1 0 0 1 1 1].

To design $H_2$, various methodologies may be used and various constraints may be applied. For example only, constraints may include a girth constraint on the underlying graph, such as a shortest loop constraint and/or a number/distribution of shortest loops. This constraint may improve performance, which may be measured as the decoding success rate.

Additional constraints may include constraints imposed by hardware implementations that decrease memory complexity when performing encoding or decoding using the designed matrix. In addition, a graph conditioning algorithm, such as an approximate cycle extrinsic message degree (ACE) algorithm may be used.

To allow for efficient implementation of storage and processing units, structured parity check matrices may be designed, such as those associated with quasi-cyclic codes. Quasi-cyclic codes may be defined by a parity check matrix having M by N sub-blocks, as shown here:

| $C_{1,1}$ | $C_{1,2}$ | ... | $C_{1,N}$ |
|---|---|---|---|
| $C_{2,1}$ | $C_{2,2}$ | ... | $C_{2,N}$ |
| ... | ... |  | ... |
| $C_{M,1}$ | $C_{M,2}$ | ... | $C_{M,N}$ |

Each sub-block C may be a circulant, which is a square matrix of size $S_c$ by $S_c$, where $S_c$ signifies circulant size. The size of the parity check matrix of the quasi-cyclic code is therefore (M times $S_c$) by (N times $S_c$). Circulants may be designed by specifying a first row of the circulant and then cyclically shifting that row for each additional row. For example only, a five-by-five circulant is shown here:

$$C_{i,j} = \begin{bmatrix} 0 & 0 & 1 & 0 & 0 \\ 0 & 0 & 0 & 1 & 0 \\ 0 & 0 & 0 & 0 & 1 \\ 1 & 0 & 0 & 0 & 0 \\ 0 & 1 & 0 & 0 & 0 \end{bmatrix}$$

In simplified terms, the weight of a row is equal to the sum of the ones in that row, while the weight of a column is equal to the number of ones in the column. Therefore, each row of the above circulant has a weight of 1, and the circulant is referred to as a weight-1 circulant.

For purposes of illustration only, examples of a weight-0 and a weight-2 circulant, where $S_c$ equals 5, are shown:

$$C_{ij} = \begin{bmatrix} 0 & 0 & 0 & 0 & 0 \\ 0 & 0 & 0 & 0 & 0 \\ 0 & 0 & 0 & 0 & 0 \\ 0 & 0 & 0 & 0 & 0 \\ 0 & 0 & 0 & 0 & 0 \end{bmatrix}$$

$$C_{ij} = \begin{bmatrix} 1 & 0 & 1 & 0 & 0 \\ 0 & 1 & 0 & 1 & 0 \\ 0 & 0 & 1 & 0 & 1 \\ 1 & 0 & 0 & 1 & 0 \\ 0 & 1 & 0 & 0 & 1 \end{bmatrix}$$

To design $H_1$ and $H_2$, row and column distributions may be determined based on row and column weight constraints. For example only, row and column distribution may be determined using density-evolution or exit chart tools. Row and column weight constraints may be set separately for $H_1$, $H_1'$, and $H_2$. $H_2$ has the constraint that the upper right corner is an all-0 matrix (formed of all-0 circulants).

The remainder of $H_2$ may be determined by using progressive-edge growth. For example only, the columns of $H_2$ may be determined in order from right to left. In other words, after the right-most column is determined, the column second from the right is determined, and so on.

Figures 10A, 10B:
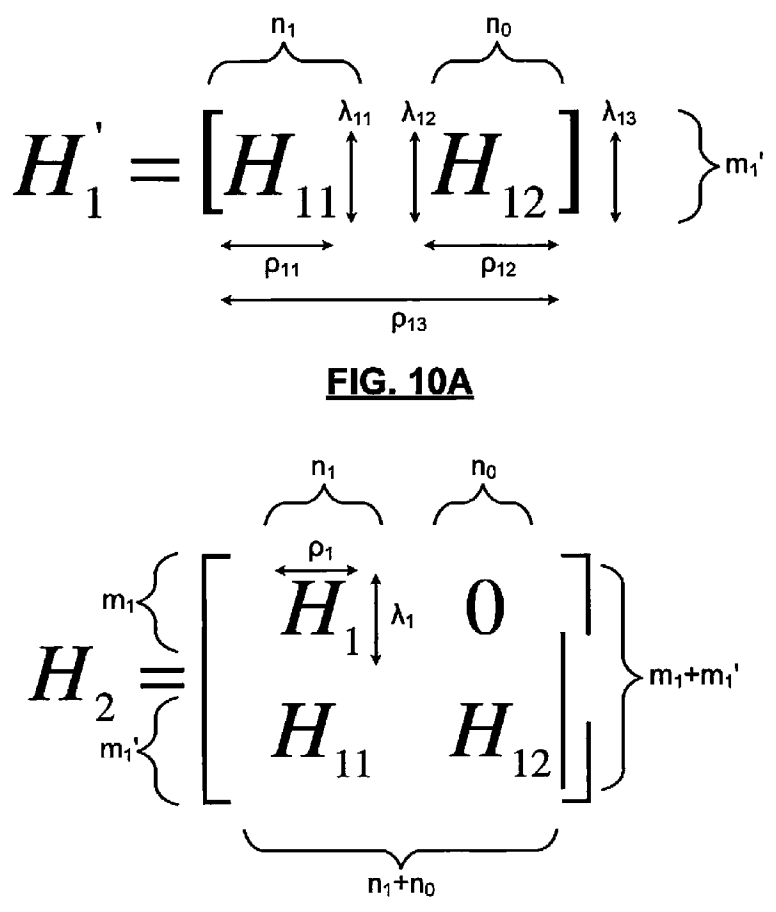

Referring now to FIGS. 10A and 10B, when specifying constraints, submatrix $H_1'$ of matrix $H_2$ may be split into sub-matrices $H_{11}$ and $H_{12}$. Sub-matrices $H_{11}$ and $H_{12}$ have $m_1'$ rows, $H_{11}$ has $n_1$ columns, and $H_{12}$ has $n_0$ columns.

Average weights of portions of matrix $H_2$ can be defined as follows. An average of the weights of the columns of $H_1$ can be referred to as $\lambda_1$ while an average of the weights of the rows of $H_1$ can be referred to as $\rho_1$. An average of the weights of the columns of $H_{11}$ can be referred to as $\lambda_{11}$ while an average of the weights of the rows of $H_{11}$ can be referred to as $\rho_{11}$.

Similarly, an average of the weights of the columns of $H_{12}$ can be referred to as $\lambda_{12}$ while an average of the weights of the rows of $H_{12}$ can be referred to as $\rho_{12}$. An average of the weights of the columns of $H_1'$ can be referred to as $\lambda_{13}$ while an average of the weights of the rows of $H_1'$ can be referred to as $\rho_{13}$.

In various implementations, $H_2$ is designed by setting various constraints on the row and column weights. For example only, the following general constraints may be applied:

$$\lambda_{11} = \frac{m_1'}{n_1}\rho_{11}$$

$$\lambda_{12} = \frac{m_1'}{n_0}\rho_{12}$$

$$\lambda_1 = \frac{m_1}{n_1}\rho_1 \text{ and}$$

$$n_0\lambda_{12} + n_1(\lambda_1 + \lambda_{11}) = m_1\rho_1 + m_1'(\rho_{11} + \rho_{12})$$

These general constraints may produce a matrix $H_2$ exhibiting good performance. Additional constraints may be applied to row and column weights, as described in the following three examples.

In a first example, the weights of every row of $H_2$ can be set equal. This means that $\rho_1 = \rho_{13}$ and $\rho_1 = \rho_{11} + \rho_{12}$. In addition, $$\lambda_{11} = \frac{m_1'}{n_1}\rho_{11}$$

$$\lambda_{12} = \frac{m_1'}{n_0}\rho_{12}$$

$$\lambda_1 = \frac{m_1}{n_1}\rho_1 \text{ and}$$

$$n_0\lambda_{12} + n_1(\lambda_1 + \lambda_{11}) = (m_1 + m_1')\rho_1$$

Therefore, assuming that $\rho_1$ has been specified, $\rho_{11}$ offers a degree of freedom in designing the matrix $H_2$.

In a second example, the average column weight of $H_{12}$ and of the combined columns of $H_1$ and $H_{11}$ may be set equal. In other words, $\lambda_{12} = \lambda_1 + \lambda_{11}$. Then, $$\rho_{11} = \frac{n_1'}{m_1'}\lambda_{11}$$

$$\rho_{12} = \frac{n_0}{m_1'}\lambda_{12}$$

$$\rho_1 = \frac{n_1}{m_1}\lambda_1 \text{ and}$$

$$(n_0 + n_1)\lambda_{12} = m_1\rho_1 + m_1'(\rho_{11} + \rho_{12})$$

Assuming that $\lambda_{12}$ has been specified, $\lambda_1$ offers a degree of freedom in designing the matrix $H_2$.

In a third example, the constraints of the first and second examples may be combined. Then, $\rho_1 = \rho_{11} + \rho_{12}$ and $\lambda_{12} = \lambda_1 + \lambda_{11}$. In addition, $$\lambda_{11} = \frac{m_1'}{n_1}\rho_{11}$$

$$\lambda_{12} = \frac{m_1'}{n_0}\rho_{12}$$

$$\lambda_1 = \frac{m_1}{n_1}\rho_1 \text{ and}$$

$$\lambda_{12} = \frac{m_1 + m_1'}{n_1 + n_0}\rho_1$$

Once $\lambda_{12}$ and $\rho_{11}$ have been specified, additional degrees of freedom may not be needed.

These examples may provide acceptable performance—i.e., result in low decoding failure rates. For example only, the probability of decoding failure ($P_e$) may be determined as follows:

$$P_e = 1 - \lfloor (1-P_w)^M + M \cdot (P_w - P_s)(1-P_w)^{M-1} \rfloor$$

where M is the number of weak component codewords (codewords of $H_1$), $P_s$ is the decoding error rate of the strong code ($H_2$), and $P_w$ is the decoding error rate of the weak code ($H_1$).

The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

What is claimed is:

1. An encoding system comprising:
   a first low density parity check (LDPC) module configured to generate a first encoded codeword by encoding a first codeword using a first LDPC code; and
   a second LDPC module configured to generate a second encoded codeword by encoding a second codeword using a second LDPC code, wherein:
   signals based on the first encoded codeword and signals based on the second encoded codeword are transmitted over a communications channel,
   the first LDPC code is defined by a first parity check matrix,
   the second LDPC code is defined by a second parity check matrix, and
   the second parity check matrix includes the first parity check matrix, a zero matrix, and a supplementary matrix.

2. The encoding system of claim 1, wherein:
   the zero matrix has a same number of rows as the first parity check matrix, and
   the supplementary matrix has a number of columns equal to a sum of a number of columns of the first parity check matrix and a number of columns of the zero matrix.

3. The encoding system of claim 1, further comprising an exclusive OR (XOR) module that generates the second codeword based on an XOR of the first codeword and an intermediate codeword.

4. The encoding system of claim 3, further comprising a second XOR module configured to generate an XOR codeword based on an XOR of the first and second encoded codewords, wherein signals based on the XOR codeword are transmitted over the communications channel.

5. The encoding system of claim 4, further comprising a multiplexer module configured to output the first encoded codeword and the XOR codeword for transmission over the communications channel.

6. The encoding system of claim 3, further comprising a demultiplexer module configured to create first and second input codewords by demultiplexing user data, wherein the first codeword is based on the first input codeword, and wherein the intermediate codeword is based on the second input codeword.

7. The encoding system of claim 6, further comprising:
   a first error-detecting code module configured to generate the first codeword based on the first input codeword using an error-detecting code; and
   a second error-detecting code module configured to generate the intermediate codeword based on the second input codeword using the error-detecting code.

8. The encoding system of claim 7, wherein the error-detecting code is a cyclic redundancy check code.

9. The encoding system of claim 3, further comprising:
   N LDPC modules including the first LDPC module, wherein:
   N is an integer greater than or equal to 2,
   the N LDPC modules are configured to generate N encoded codewords based on N codewords using the first LDPC code,
   the N encoded codewords include the first encoded codeword,
   the N codewords include the first codeword, and
   the XOR module generates the second codeword based on an XOR of the N codewords and the intermediate codeword.

10. An integrated circuit comprising the encoding system of claim 1.

11. A method comprising:
    generating a first encoded codeword by encoding a first codeword using a first low density parity check (LDPC) code;
    generating a second encoded codeword by encoding a second codeword using a second LDPC code; and
    transmitting signals based on the first encoded codeword and signals based on the second encoded codeword over a communications channel, wherein:
    the first LDPC code is defined by a first parity check matrix,
    the second LDPC code is defined by a second parity check matrix, and
    the second parity check matrix includes the first parity check matrix, a zero matrix, and a supplementary matrix.

12. The method of claim 11, wherein:
    the zero matrix has a same number of rows as the first parity check matrix, and
    the supplementary matrix has a number of columns equal to a sum of a number of columns of the first parity check matrix and a number of columns of the zero matrix.

13. The method of claim 11, further comprising generating the second codeword based on an exclusive OR (XOR) of the first codeword and an intermediate codeword.

14. The method of claim 13, further comprising:
    generating an XOR codeword based on an XOR of the first and second encoded codewords, and
    transmitting signals based on the XOR codeword over the communications channel.

15. The method of claim 14, further comprising outputting the first encoded codeword and the XOR codeword for transmission over the communications channel.

16. The method of claim 13, further comprising:
    creating first and second input codewords by demultiplexing user data;
    generating the first codeword based on the first input codeword; and
    generating the intermediate codeword based on the second input codeword.

17. The method of claim 16, further comprising:
    generating the first codeword based on the first input codeword using an error-detecting code; and
    generating the intermediate codeword based on the second input codeword using the error-detecting code.

18. The method of claim 17, wherein the error-detecting code is a cyclic redundancy check code.

19. The method of claim 13, further comprising:
    generating N encoded codewords based on N codewords using the first LDPC code; and
    generating the second codeword based on an XOR of the N codewords and the intermediate codeword, wherein:
    N is an integer greater than or equal to 2,
    the N encoded codewords include the first encoded codeword, and
    the N codewords include the first codeword.

* * * * *